United States Patent
Jeong

(10) Patent No.: US 7,579,256 B2
(45) Date of Patent: Aug. 25, 2009

(54) METHOD FOR FORMING SHALLOW TRENCH ISOLATION IN SEMICONDUCTOR DEVICE USING A PORE-GENERATING LAYER

(75) Inventor: Ho Seok Jeong, Dobong-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 463 days.

(21) Appl. No.: 11/320,686

(22) Filed: Dec. 30, 2005

(65) Prior Publication Data

US 2006/0148202 A1    Jul. 6, 2006

(30) Foreign Application Priority Data

Dec. 30, 2004    (KR) .................. 10-2004-0117513

(51) Int. Cl.
*H01L 21/76* (2006.01)
(52) U.S. Cl. .................. 438/424; 438/296; 438/404; 257/E21.546
(58) Field of Classification Search ........... 438/218, 438/221–224, 294–296, 319, 359–361, 400–454, 438/787, 207, 778; 257/E21.546–E21.55, 257/E21.573, E23.013, E21.545, E21.565; 427/532–560
See application file for complete search history.

(56) References Cited

U.S. PATENT DOCUMENTS

| | | | | | |
|---|---|---|---|---|---|
| 6,037,237 | A | * | 3/2000 | Park et al. | 438/424 |
| 6,165,890 | A | * | 12/2000 | Kohl et al. | 438/619 |
| 6,261,914 | B1 | * | 7/2001 | Divakaruni et al. | 438/359 |
| 6,261,942 | B1 | * | 7/2001 | Zhou et al. | 438/619 |
| 6,319,854 | B1 | * | 11/2001 | Aoi | 438/781 |
| 6,998,325 | B2 | * | 2/2006 | Yunogami et al. | 438/409 |
| 7,060,587 | B2 | * | 6/2006 | Bearda et al. | 438/409 |
| 7,112,615 | B2 | * | 9/2006 | Gleason et al. | 521/77 |
| 7,153,754 | B2 | * | 12/2006 | Farnworth et al. | 438/409 |
| 2003/0092240 | A1 | * | 5/2003 | Kong et al. | 438/404 |
| 2004/0048437 | A1 | * | 3/2004 | Dubin | 438/296 |
| 2005/0040533 | A1 | * | 2/2005 | Farnworth et al. | 257/758 |
| 2006/0116000 | A1 | * | 6/2006 | Yamamoto | 438/795 |

* cited by examiner

*Primary Examiner*—Matthew C Landau
*Assistant Examiner*—Joseph C Nicely
(74) *Attorney, Agent, or Firm*—Lowe Hauptman Ham & Berner, LLP

(57) ABSTRACT

A method for forming shallow trench isolation in a semiconductor device including forming a pad oxide, a pad nitride, and a pore-generating layer on an entire surface of a semiconductor substrate in successive order; etching the pore-generating layer, the pad nitride, the pad oxide and the substrate to form a trench in the substrate; forming a trench oxide over the entire surface of the substrate by a CVD process to fill the trench; and removing the trench oxide in an active device area while retaining the trench oxide in the trench.

2 Claims, 5 Drawing Sheets

METHOD FOR FORMING SHALLOW TRENCH ISOLATION IN SEMICONDUCTOR DEVICE USING A PORE-GENERATING LAYER

This application claims the benefit of Korean Application No. 10-2004-0117513, filed on Dec. 30, 2004, which is incorporated by reference herein in its entirety.

BACKGROUND OF THE INVENTION

1. Field of the Invention

The present invention relates generally to semiconductor device manufacturing technology, and particularly to a method for forming shallow trench isolation in a semiconductor device.

2. Description of the Related Art

Manufacturing processes of highly integrated semiconductor devices involve forming a variety of components, such as a transistor, capacitor, metal wiring, etc., in very restricted regions, and forming highly insulated regions to prevent parasitic current leakage between the components.

Conventionally, a local oxidation of silicon (LOCOS) field oxide, formed by oxidizing a silicon substrate, has been widely used for isolating the components of the semiconductor device. However, because of the increase in the integration density, a LOCOS field oxide has become disadvantageous to the formation of integrated circuits, because it generally includes a "bird's beak" that may invade an active device region. Accordingly, a lot of alternative isolation technologies, more advantageous to the higher integration of devices, have been developed. As a typical example of such alternative isolation technologies, shallow trench isolation (STI) having a superior insulating performance and a relatively small formation area has been widely used for isolating transistors in higher integrated metal oxide semiconductor (MOS) and bipolar devices.

In a typical STI process, a pad oxide and a pad nitride are formed on an entire silicon substrate in successive order to protect an active device area. A photoresist layer is formed and patterned on the pad nitride by a photolithography process. The photoresist pattern defines an opening over an isolation area of the substrate.

After the exposure of the pad nitride by the photoresist pattern, the pad nitride and pad oxide are partially removed by an anisotropic etching process using the photoresist pattern as an etching mask. This etching process is performed to expose the isolation area in which a trench structure may be formed. Subsequently, the exposed isolation area of the substrate is etched to a predetermined depth by an anisotropic etching process, so that a trench structure is formed in the substrate. The photoresist pattern is removed, and the substrate is then cleaned.

After the formation of the trench structure, a trench oxide, e.g., a chemical vapor deposited (CVD) dielectric such as silicon dioxide, is formed over the entire substrate, filling the trench. Since this trench oxide also covers the active device area, and it should be selectively removed for device processing to continue. This is accomplished by planarizing the substrate, typically via chemical-mechanical polishing (CMP), using the pad silicon nitride layer over the active device area as a stop layer. This process removes the trench oxide from the active device area while retaining it in the isolation trenches. The pad nitride and pad oxide are then removed, resulting in a highly planar substrate with isolated device areas.

FIG. 1 is a scanning electron microscopy (SEM) image of a semiconductor structure, right before the CMP process, including the substrate 10, the trench sidewall 20, the trench oxides 30$a$ and 30$b$, the pad oxide 22, and the pad nitride 24. Here, reference numeral 40 indicates a silicon nitride layer formed on the trench oxide for the SEM observation.

FIG. 1 shows the STI structure having a wide trench dimension. In FIG. 1, the mark S indicates the point where the vertical line h1 extending from the bottom of the trench meets the top surface of the trench oxide 30$a$ filling the trench. The mark M indicates the point where the vertical line h2 extending from the top surface of the pad nitride 24 meets the top surface of the trench oxide 30$b$ deposited on the active device area. As shown in FIG. 1, there is a considerable difference in the altitude between the points S and M. This phenomenon, commonly observed in the case of a low density of trenches per unit area, means that the surface topology of the trench oxide is uneven between the active device area and the isolation area. The uneven surface topology of the trench oxide may result in a poor planarization in the CMP process. Specifically, since the CMP process continues until the pad nitride is exposed in the active device area, the trench oxide in the isolation area may be excessively polished. As a result, an upper portion of the trench oxide deposited in the isolation area may be deeply dug out, which is generally called a dishing condition, and the substrate may be damaged in the vicinity of the upper corners of the isolation trench.

SUMMARY OF THE INVENTION

It is, therefore, an object of the present invention to provide a method for forming shallow trench isolation in a semiconductor device, which can prevent the dishing condition or damage to the trench isolation during a CMP process. The shallow trench isolation has a smooth surface topology after the CMP process.

To achieve the above objects, an embodiment of a method for forming shallow trench isolation in a semiconductor device, according to the present invention, includes: forming a pad oxide, a pad nitride, and a pore-generating layer on an entire surface of a semiconductor substrate in successive order; etching the pore-generating layer, the pad nitride, the pad oxide and the substrate to form a trench in the substrate; forming a trench oxide over the entire surface of the substrate by a CVD process to fill the trench; and removing the trench oxide in an active device area while retaining the trench oxide in the trench.

Preferably, the pore-generating layer is liquefied or sublimated in the course of the CMP process, thus forming a pore inside the trench oxide formed in the active device area. The pore-generating layer may comprise a material that is inactive to the trench oxide. Before the formation of the trench, a liner oxide can be formed in a sidewall of the trench.

It is to be understood that both the foregoing general description of the invention and the following detailed description are exemplary, but are not restrictive of the invention.

BRIEF DESCRIPTION OF DRAWINGS

These and other aspects of the present invention will become evident by reference to the following description of the invention, often referring to the accompanying drawings.

DETAILED DESCRIPTION OF THE INVENTION

An exemplary embodiment of a method for forming shallow trench isolation in a semiconductor device, according to the present invention, is described hereinafter, with reference to FIGS. 2A to 2G.

Figure 1:
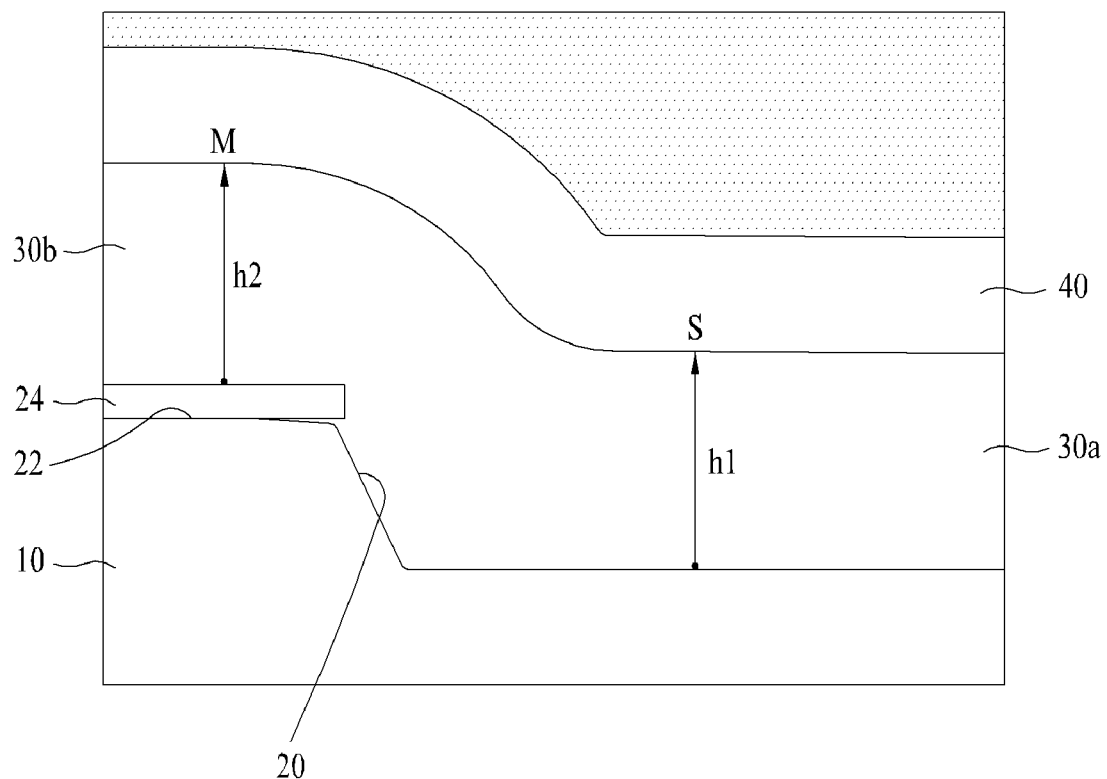
FIG. 1 is a scanning electron microscopy (SEM) image of an isolation trench structure formed by a conventional method, illustrating the uneven surface topology of trench oxide deposited in an active device area and an isolation area of a semiconductor substrate.
Figure 2A:
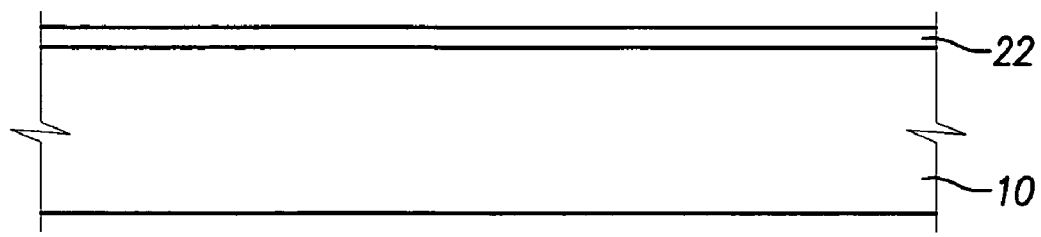
FIGS. 2A to 2G are cross-sectional views of an isolation trench structure, illustrating a method for forming STI in a semiconductor substrate, according to an embodiment of the present invention.
Figure 2B:
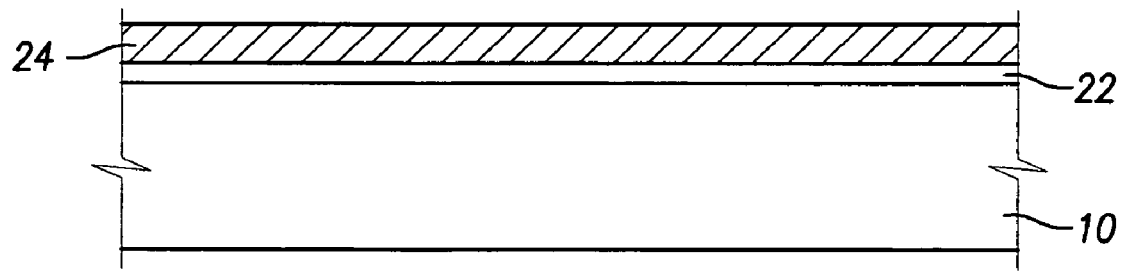
Figure 2C:
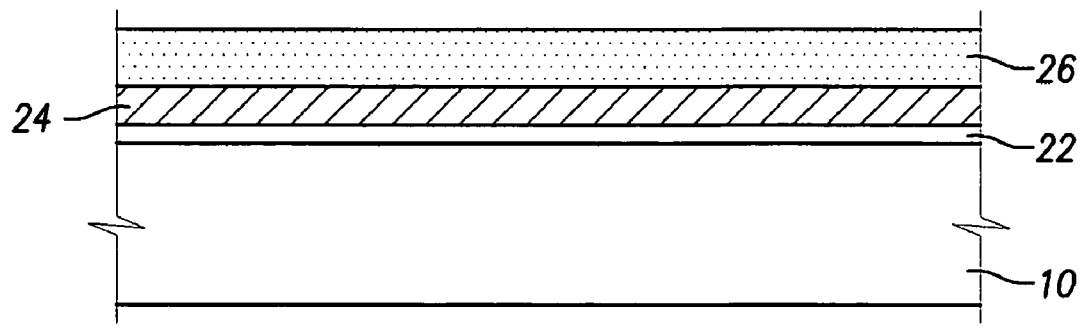

First, a pad oxide 22 is formed with a thickness of about 150 Å on a silicon substrate 10, as shown in FIG. 2A. The pad oxide 22 serves a buffer to reduce the silicon lattice stress due to a silicon nitride that may be formed thereon. After formation of the pad oxide 22, a pad nitride 24 is deposited with a thickness of about 2000 Å, as shown in FIG. 2B. Next, a pore-generating layer 26 is formed on the pad nitride 24, as shown in FIG. 2C. The pore-generating layer 26 may be liquefied or sublimated in the course of a CVD process for forming a trench oxide, thus forming liquid or gas containing pores within the CVD trench oxide deposited in an active device area. To form the pore-generating layer 26, a liquid is applied and then solidified on the pad nitride 24. Any material, such as polymer, that can be liquefied or sublimated at the processing temperature of the CVD process can be used as a source material of the pore-generating layer 26. In particular, the pore-generating material preferably has a good interface adherence and low reactivity with the silicon nitride.

Figure 2D:
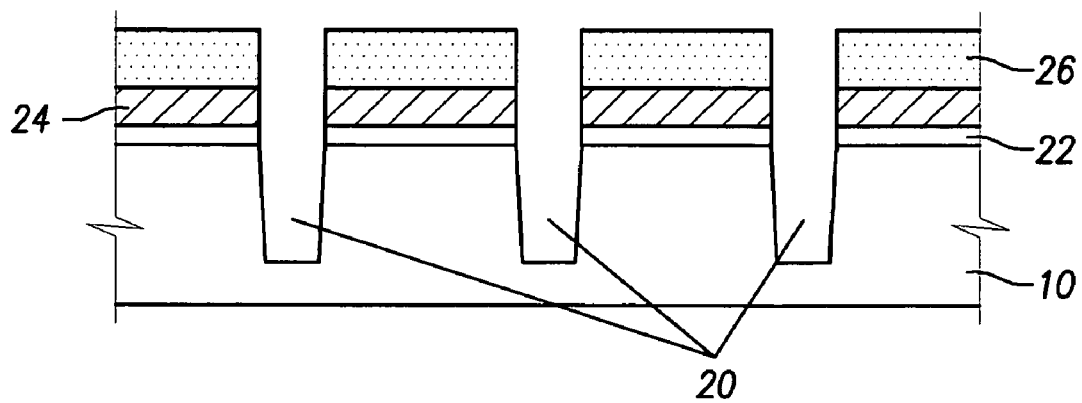

Subsequently, a photoresist pattern (not shown) is formed on the pore-generating layer 26 by a photolithography process. The photoresist pattern defines an opening over the isolation area in which a trench structure 20 may be formed (see, e.g., trench structure 20 in FIG. 2D). After the formation of a photoresist pattern, the pore-generating layer 26, the pad nitride 24, and the pad oxide 22 are partially removed in successive order by an etching process, exposing the isolation area of the substrate 10. The exposed isolation region of the substrate 10 is then etched to a predetermined depth, as shown in FIG. 2D. After the trench etch, the photoresist pattern is removed, and the substrate 10 is then cleaned.

Figure 2E:
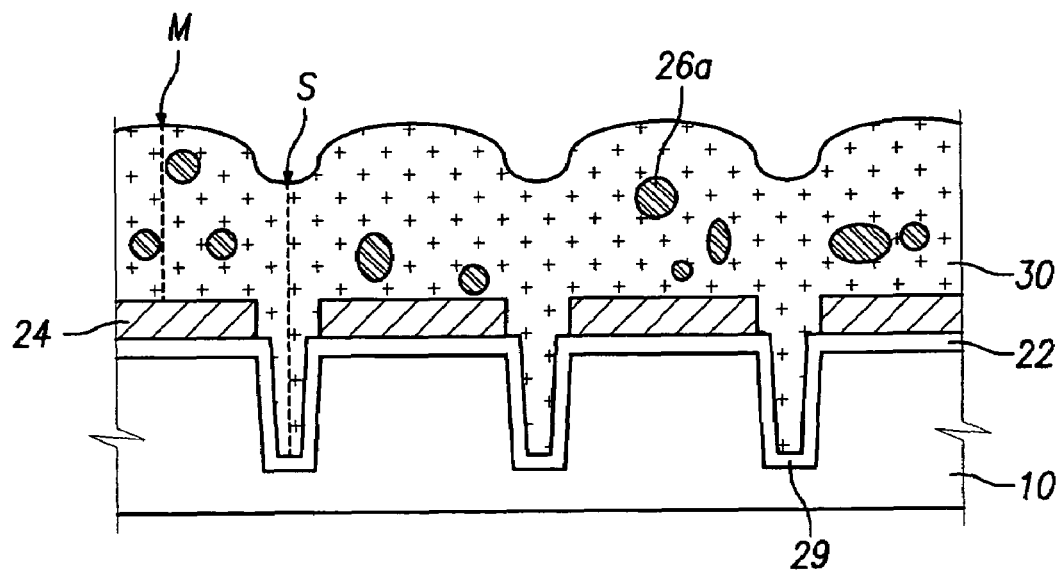

Referring to FIG. 2E, the substrate may undergo processes for forming a liner oxide 29 and a trench oxide 30. The liner oxide 29 is formed with a thickness of about 270 Å on the trench sidewalls. The liner oxide 29 serves as a buffer to eliminate any etch damage to the trench sidewall by consuming a small amount of the sidewall material and forming a high-quality interface between the silicon trench sidewall and the subsequently deposited trench oxide. The trench oxide 30 is formed on the entire substrate 10 by the CVD process using an $O_3$-TEOS (Tetra Ethyl Ortho Silicate) film or a high-density plasma CVD (HDP-CVD) process, filling the trenches 20. In the CVD process, the pore-generating layer 26 can be liquefied or sublimated by the high-temperature environment. When the CVD oxide is deposited on the substrate, the liquefied or sublimated material of the pore-generating layer 26 is confined within the CVD oxide 30 over the active device area, thus forming pores 26a. FIG. 2E shows the condition that a large quantity of pores is trapped by the CVD oxide in the active device area.

After the formation of the CVD trench oxide, the substrate is planarized by a CMP process. In case of a wide trench structure, or a low density of trenches per a unit area, the CVD oxide 30 may have an uneven surface topology as shown in FIG. 2E. In other words, the point M of the CVD oxide over the active device area is higher that the point S of the CVD oxide over the isolation area.

A great difference of the altitude between the points S and M may induce an excessive polishing in the CMP process, thus resulting in the dishing condition of the trench oxide or damage to the substrate. However, as shown in FIG. 2E, a large quantity of pores 26 trapped in the CVD oxide can balance the polished amount of the CVD oxide between the active device area and the isolation area. Namely, the density of the CVD oxide deposited over the active device area of the substrate is decreased due to pores 26a, so that the CVD oxide in the active device area is removed faster than that in the isolation area. Accordingly, the substrate can be polished and planarized without the occurrence of a dishing condition and damage to the isolation trench.

Figure 2F:
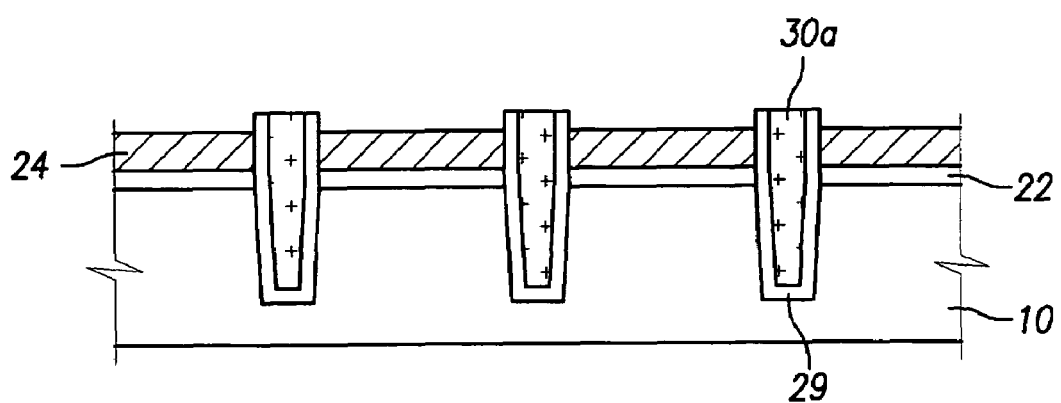
Figure 2G:
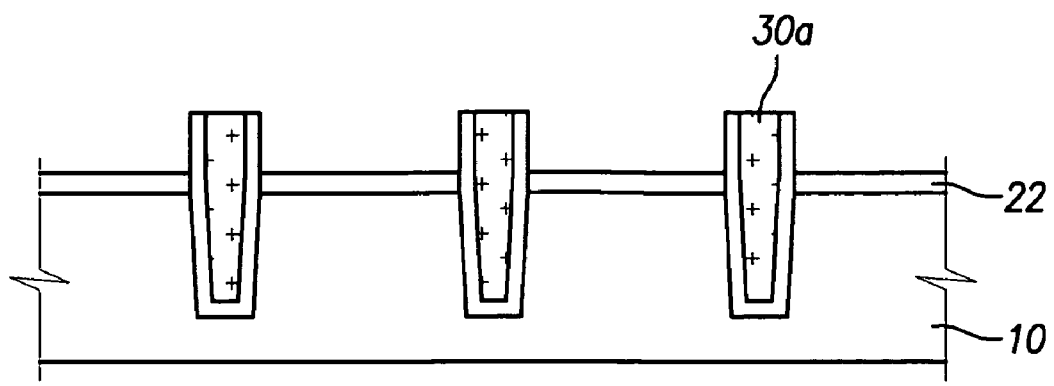

FIG. 2F shows a cross section of the semiconductor structure with the isolation trench after the CMP process. Reference numeral 30a indicates the trench oxide filling the trench. The trench oxide 30a has a relatively even surface topology, without being dug out. Afterwards, the pad nitride 24 is removed, resulting in the isolation trench structure as shown in FIG. 2G.

In a conventional method, the dishing condition and substrate damage in the isolation area may occur during the CMP process. However, according to the present invention, a large quantity of pores, resulting from the pore-generating layer, decreases the density of the CVD oxide over the active device area, which leads to a balance of the polished amount of the CVD oxide between the active device area and the isolation area. As a result, the CMP process for planarizing the semiconductor substrate can be performed while maintaining a smooth surface topology of the CVD oxide.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming shallow trench isolation in a semiconductor device using a pore-generating layer, comprising:
    forming a pad oxide, a pad nitride, and the pore-generating layer on an entire surface of a semiconductor substrate in successive order;
    etching the pore-generating layer, the pad nitride, the pad oxide and the substrate to form a trench in the substrate;
    forming a trench oxide over the entire surface of the substrate by a CVD process to fill the trench, and forming a gas or a liquid pore inside the trench oxide by liquefying or sublimating the pore-generating layer during the CVD process; and
    removing the trench oxide in an active device area while retaining the trench oxide in the trench,
    wherein the pore-generating layer being formed with a material that is inactive with the trench oxide.

2. The method of claim 1, further comprising forming a liner oxide in a sidewall of the trench before forming the trench oxide.

* * * * *